United States Patent [19]

Zirwas

[11] 4,061,984
[45] Dec. 6, 1977

[54] TRANSISTOR POWER AMPLIFIER FOR TRANSMITTING SYSTEMS

[75] Inventor: Johann Gerhard Zirwas, Groebenzell, Germany

[73] Assignee: Siemens Aktiengesellschaft, Berlin & Munich, Germany

[21] Appl. No.: 721,475

[22] Filed: Sept. 8, 1976

[30] Foreign Application Priority Data

Sept. 24, 1975 Germany .................. 2542638

[51] Int. Cl.$^2$ .................................. H03F 1/26
[52] U.S. Cl. ........................ 330/149; 330/252; 330/124 R; 330/151
[58] Field of Search ............ 330/30 R, 149, 151, 330/124 R; 325/475, 476; 328/163

[56] References Cited

U.S. PATENT DOCUMENTS 3,815,040   6/1974   Seidel ...................... 330/151 X

*Primary Examiner*—Lawrence J. Dahl
*Attorney, Agent, or Firm*—Hill, Gross, Simpson, Van Santen, Steadman, Chiara & Simpson

[57] ABSTRACT

A transistor power amplifier for transmitting systems, particularly high frequency systems, has two parallel connected signal paths each of which is fed with the input signal. In a first of the signal paths, a 6 dB attenuator connects the input to the input of an amplifier and a fraction of the output of the amplifier is connected to one input of a correction amplifier, constructed as a differential amplifier. In the other signal path a delay member which simulates the delay of the first amplifier connects the circuit input to another input of the correction amplifier. The correction amplifier therefore is provided with a fraction of a delayed amplified signal which is subjected to error and includes an error component and with the delayed original input signal and emits a control signal for a second amplifier in which the error component produced in the first amplifier is contained in a double and inverted magnitude. A parallel connection of this signal with the delayed original input signal, further attenuated by 3 dB, is provided to the second amplifier which is in the second signal path. A second delay member is connected to the output of the first amplifier to simulate the delay of the second amplifier, and the second delay member and the output of the second amplifier are provided in a parallel connection to produce the output of the transistor power amplifier.

3 Claims, 3 Drawing Figures

TRANSISTOR POWER AMPLIFIER FOR TRANSMITTING SYSTEMS

BACKGROUND OF THE INVENTION

1. Field of the Invention

The present invention relates to a transistor power amplifier for transmitting systems, particularly high frequency systems, having two parallel-connected signal paths which are fed on the input side with an input signal by way of a first branch connection and are again combined on the output side by way of a second branch connection.

2. Description of the Prior Art

Power amplifiers having power outputs from between several 100 watts to several 1000 watts are required, for example, for transmitter stages in high frequency transmission systems, such as relay stations, among other applications. In short wave transmitters in the frequency range of between 1.5 and 30 MHz, the field of application of point-to-point connections by way of medium and large distances are of interest, whereby high requirements are made with respect to the linearity of amplification, to such an extent that, according to CCIR, for example, intermodulation values of 35 dB are required for specific instances of application.

In contrast to tube technology, the power required can be delivered with transistor transmitters in a single amplifier stage in the lowest values, at best, due to the limitation of permissible temperatures and heat resistances of transistors. One manner of obtaining a higher power output, therefore, most often involved a parallel connection of a plurality of push-pull stages, such as is apparent from the block circuit diagram illustrated in FIG. 1, for example. An input signal E is first separated into two signal paths by way of a first branch connection 1, such as a two-four wire coupling, and each of these paths are further separated into a total of four signal paths by way of two additional branch connections 2 and 3. An amplifier stage 4, 5, 6, 7 is provided in a respective path. At the output side, the amplifiers are interconnected in pairs, respectively, by way of two branch connections 8, 9 and finally interconnected by way of another branch connection 10 to provide an output A. However, in addition to the insufficient power output in the case of transistor amplifiers, there is also the problem of insufficient linearity, so that the required intermodulation intervals can most often not be maintained. An improvement in the linearity by means of a sub-operation cannot be achieved for Class B operation. Similarly, inverse feedback measures are ruled out, practically speaking, because of the low cut-off frequency of broad band amplifiers and the variable terminating impedances.

An additional prior art possibility for improving the linearity of high power broad band amplifiers results from the application of the so-called "feed-forward" method, which has also become known as "forward coupling". In this connection, one may refer to United States Letters Patent 3,649,927.

FIG. 2 illustrates in block diagram form, an amplifier which functions according to the feed forward principle. The input signal E is uniformly separated into two parallel signal paths I and II by way of a branching network, for example a branch connection 11. The input signal E transmitted in the signal path I first passes through a primary amplifier HV having an amplification G1 and a group or envelope delay $\tau 1$. The output of the amplifier HV is subject to an error component characterized by non-linearities. A fraction of the output signal of the amplifier HV is provided by way of a directional coupler RK, for example. The fraction tapped is attenuated by the factor 1/G1 and compared with the output signal transmitted in the signal path II which has been delayed by an amount $\tau 1$ with the aid of a cable, for example. By subtracting both signals, the pure error component $\epsilon$ remains, which error component is raised to the level of the main amplifier output signal in a correction amplifier KV connected in the signal path II. An additional delay member simulates the delay $\tau 2$ of the correction amplifier KV. An additional branch connection 12 is provided at the output of the amplifier arrangement in which the delayed output signal (with the error component $\epsilon$) of the primary amplifier HV in the signal path I and the error component $\epsilon$, with a negative sign, appearing at the end of the signal path II, are combined in such a fashion that both error components cancel one another.

SUMMARY OF THE INVENTION

The object of the present invention is to provide a transistor power amplifier which is suitable for transmitter stages, particularly in the high frequency range, which is distinguished, above all, by good linearities.

Proceeding from a power amplifier of the type mentioned above, the present invention is realized by applying the principle of forward coupling in such a manner that a delay element is connected in parallel to the first amplifier of the first signal path. The delay element is located in the second signal path and simulates the delay of the first amplifier. At the output of the first amplifier and of the first delay member, a respective input of a correction amplifier is connected, the correction amplifier being constructed as a differential amplifier. The signals supplied to the correction amplifier, which consists of a fraction of the amplified input signal which has been subjected to an error component, on the one hand, and the original input signal, on the other hand, delayed, cause the correction amplifier to produce a control signal for a second amplifier located in the second signal path. The error component produced in the first amplifier is contained in the control signal in a doubled and inverted magnitude. A second delay member is connected to the output of the first amplifier and simulates the delay of the second amplifier. The second delay member and the second amplifier are interconnected on the output side by way of a second branch connection. A circuit constructed in accordance with the present invention advantageously makes use of the fact that at least two parallel signal paths are already present in transistor power amplifiers for transmitting stages, because of the power required, so that no significant increased expense is involved due to the application of the feed forward principle. A special advantage results from the fact that the amplifier provided in the second signal path is not used as a pure correction amplifier, but additionally for the purpose of intelligence signal amplification.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
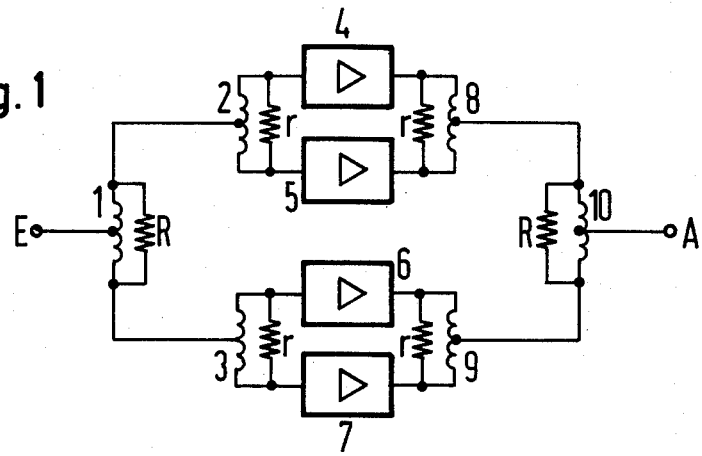
FIG. 1 is a block circuit diagram of a multi-branch amplifier circuit which is known in the art.
Figure 2:
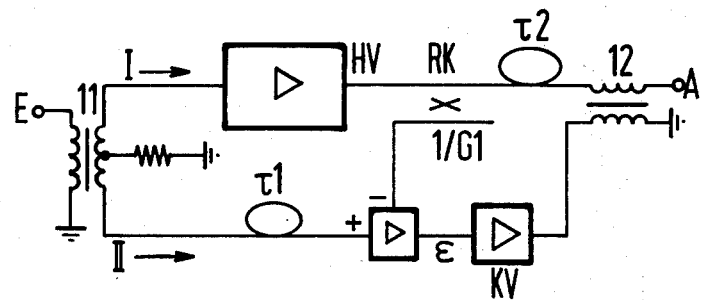
FIG. 2 is a block circuit diagram of the forward coupling principle.

The circuits illustrated in FIGS. 1 and 2 have been discussed above in detail, and it is not necessary to become involved in a further discussion thereof.

Figure 3:
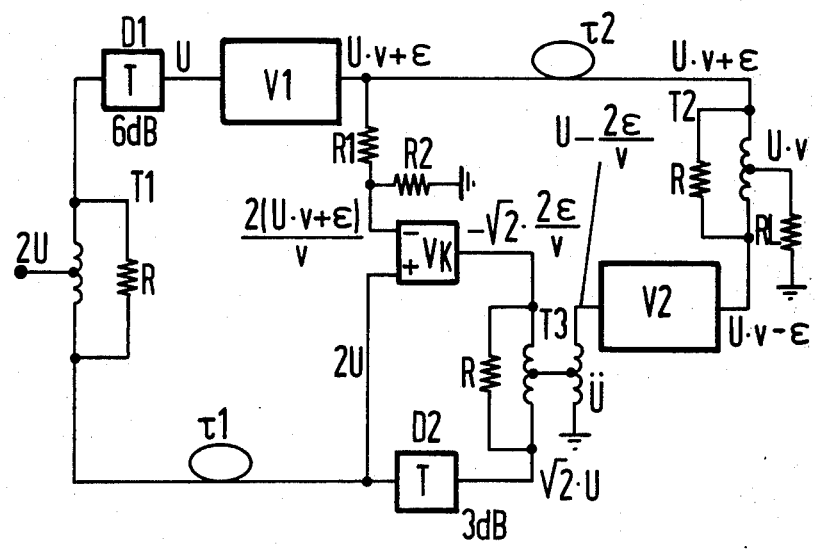
FIG. 3 is a block circuit diagram of a transistor power amplifier constructed in accordance with the principles of the present invention.

Referring to FIG. 3, however, an input signal 2U is fed to the amplifier input and is uniformly separated into two signal paths I and II by means of a power distribution network T1. In the signal path I, the input signal is first attenuated by 6 dB in an attenuator D1, so that the following amplifier V1 is only fed with half the signal level U of the intelligence signal. A delay member is connected in the signal path II in parallel to the amplifier V1. The delay member simulates the transit time $\tau 1$ of the amplifier V1 and can be realized by means of a piece of coaxial cable, for example. Possibly, the delay element may be supplemented by a low pass filter. A part of the signal occurring at the output of the amplifier V1, which is composed of the intelligence signal v · U, which has been amplified by the factor v, and of an error component $\epsilon$ produced by the nonlinearity of the amplifier, is now branched off from the signal path and weakened to the value $$\frac{2(U \cdot v + \epsilon)}{v}$$

by way of an attenuator which is realized by means of a series resistor R1 and a shunt resistor R2. Together with the intelligence signal 2U which is branched off from the signal path II at the output of the delay member, this signal is conveyed to a respective input of a correction amplifier $V_K$ which is constructed as a differential amplifier. In addition, the input signal 2U, which is further fed by way of the signal path II is attenuated by 3 dB in an attenuator D2. The correction amplifier $V_K$ produces output signal $$-\sqrt{2} \cdot \frac{2\epsilon}{v}$$

which is combined with the intelligence signal 2U, which has been weakened by 3 dB, by way of a branch connection T3, and fed, by way of a matching transformer Ü to the input of an amplifier V2 located in the second signal path II. This control signal U − 2$\epsilon$/v thus contains the error component produced in the first amplifier in a doubled and inverted magnitude. By way of amplification in the amplifier V2 with the amplifying factor v, a signal U · v − $\epsilon$ results at the output of the amplifier V2, whereas, at the output of the first signal path I and, indeed, at the end of the second delay element which simulates the transit time $\tau 2$ of the amplifier V2, the correspondingly delayed output signal of the amplifier V1 appears with a value U · v + $\epsilon$. Finally, both output signals are combined in a branch connection T2 in such a manner that the effective power of both signal paths reach a load resistance RL, the power of the linear distortions, however, reach a balancing resistor R of the branch connection T2.

The basic idea of this circuit consists in combining the conventional step, namely that of carrying out the power amplification in two parallel signal paths, with the principle of forward coupling, in which a correction signal is added to the main amplification path, which correction signal cancels the error occurring in the main path. For this purpose, the control for the second amplifier is formed from the input signal and the error signal such that the double negative error signal is contained therein. However, the second amplifier is used not only for the production of the correction signal, but also for the purpose of power amplification of the wanted intelligence, whereby, in case that both amplifiers V1 and V2 are similarly constructed, each amplifier contributes to an equal degree to the total power output.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A transistor power amplifier for transmission systems, particularly in the short-wave range, comprising:
    a power amplifier input, a power amplifier output, and first and second parallel-connected signal paths extending between said power amplifier input and said power amplifier output;
    first amplifier means in said first signal path including an input coupled to said power amplifier input and an output, and having a first predetermined delay time and operable to subject input signals to an error;
    second amplifier means in said second signal path including an input and an output and having a second predetermined delay time;
    first delay means in said second signal path including an input coupled to said power amplifier input and an output, and operable to simulate said first predetermined delay time;
    second delay means in said first signal path including an input connected to said output of said first amplifier means and an output, an operable to simulate said second predetermined delay time;
    output means connecting said output of said second delay means and said output of said second amplifier means to said power amplifier output;
    signal branching means connected to said output of said first amplifier means for providing a portion of the output signal of said first amplifier means;
    correction amplifier means comprising a differential amplifier including first and second inputs and an output, said first input connected to said output of said first delay means, said second input connected to said signal branching means, and said differential amplifier operable to provide a correction signal which includes the error component produced in said first amplifier means inverted and of twice the magnitude thereof; and
    signal combining means coupling said output of said first delay means and said output of said differential amplifier to said input of said second amplifier means, comprising a transformer including a primary winding coupled to said output of said first delay means and to said output of said differential amplifier and a secondary winding connected to said input of said second amplifier means.

2. The transistor power amplifier of claim 1, wherein said first and second amplifier means are identically constructed, and further comprising a first attenuator serially interposed between said power amplifier input and said input of said first amplifier means, and a second attenuator serially interposed between said output of said first delay means and said primary winding of said transformer.

3. The transistor power amplifier of claim 2, wherein the attenuator in said first signal path is a 6 dB attenuator and the attenuator in said second signal path is a 3 dB attenuator.

* * * * *